United States Patent
Idgunji et al.

(10) Patent No.: US 9,110,643 B2
(45) Date of Patent: Aug. 18, 2015

(54) LEAKAGE CURRENT REDUCTION IN AN INTEGRATED CIRCUIT

(75) Inventors: Sachin Satish Idgunji, San Jose, CA (US); Bal S Sandhu, San Jose, CA (US)

(73) Assignee: ARM Limited, Cambridge (GB)

( * ) Notice: Subject to any disclaimer, the term of this patent is extended or adjusted under 35 U.S.C. 154(b) by 339 days.

(21) Appl. No.: 13/493,236

(22) Filed: Jun. 11, 2012

(65) Prior Publication Data

US 2013/0328533 A1    Dec. 12, 2013

(51) Int. Cl.

| H03K 17/06 | (2006.01) |
|---|---|
| G06F 1/26 | (2006.01) |
| H03K 19/00 | (2006.01) |
| H03K 19/003 | (2006.01) |

(52) U.S. Cl.
CPC .............. *G06F 1/26* (2013.01); *H03K 19/0008* (2013.01); *H03K 19/00369* (2013.01); *H03K 2017/066* (2013.01); *H03K 2217/0018* (2013.01)

(58) Field of Classification Search
USPC ......... 327/403, 404, 419, 427, 534, 535, 537, 327/540, 541
See application file for complete search history.

(56) References Cited

U.S. PATENT DOCUMENTS

| 6,208,549 | B1* | 3/2001 | Rao et al. ........................ 365/96 |
| 6,630,857 | B2* | 10/2003 | Mizuno et al. ................. 327/534 |
| 2004/0257126 | A1 | 12/2004 | Choi et al. |
| 2006/0267676 | A1* | 11/2006 | Mizuno et al. ................. 327/546 |
| 2007/0096794 | A1* | 5/2007 | Houston et al. ............... 327/534 |
| 2007/0236850 | A1* | 10/2007 | Kuhn et al. .................... 361/111 |
| 2008/0180157 | A1* | 7/2008 | Choi et al. ..................... 327/384 |
| 2008/0272652 | A1* | 11/2008 | Idgunji et al. .................. 307/38 |
| 2010/0156520 | A1 | 6/2010 | Kume |
| 2010/0182850 | A1* | 7/2010 | Shiu et al. ................ 365/189.07 |
| 2010/0308919 | A1 | 12/2010 | Adamski et al. |
| 2011/0102072 | A1 | 5/2011 | Idgunji et al. |

(Continued)

FOREIGN PATENT DOCUMENTS

| GB | 2 448 962 | 11/2008 |
| WO | 2005-125012 A1 | 12/2005 |

(Continued)

OTHER PUBLICATIONS

R.J. Milliken et al, "Full On-Chip CMOS Low-Dropout Voltage Regulator" IEEE Transactions on Circuits and Systems—I: Regular Papers, vol. 54, No. 9, Sep. 2007, pp. 1879-1890.

(Continued)

*Primary Examiner* — Harry Behm
(74) *Attorney, Agent, or Firm* — Pramudji Law Group PLLC; Ari Pramudji

(57) ABSTRACT

An integrated circuit is provided with operational mode header transistors which connect a virtual power rail to a VDD power supply. A controller circuit, responsive to a sensed voltage signal from a voltage sensor which reads the virtual rail voltage VVDD, generates a control signal which controls the operational mode transistors. The control signal is derived from an interface voltage power supply that provides higher voltage VDD IO than the VDD power supply and thus able to overdrive the operational mode transistors via either a gate bias voltage or a bulk bias voltage. The amount of leakage through the operational mode transistors is controlled in a closed loop feedback arrangement so as to maintain a predetermined target value or range for the virtual rail voltage. The operational mode transistor may also be controlled to support dynamic voltage and frequency scaling.

14 Claims, 5 Drawing Sheets

(56) References Cited

U.S. PATENT DOCUMENTS

| | | |
|---|---|---|
| 2011/0260783 A1 | 10/2011 | Kawasaki |
| 2012/0126879 A1 | 5/2012 | Sandhu et al. |
| 2012/0326772 A1 | 12/2012 | Myers et al. |
| 2013/0027123 A1 | 1/2013 | Idgunji et al. |
| 2013/0328533 A1 | 12/2013 | Idgunji et al. |
| 2014/0070879 A1 | 3/2014 | Kawasaki |

FOREIGN PATENT DOCUMENTS

| | | |
|---|---|---|
| WO | WO 2006/026627 | 3/2006 |
| WO | 2006-035375 A2 | 4/2006 |
| WO | 2014-078482 A1 | 5/2014 |

OTHER PUBLICATIONS

A. Valentian et al, "Gate Bias Circuit for an SCCMOS Power Switch achieving maximum leakage reduction" IEEE 2007, pp. 300-303.
GB Search Report issued May 15, 2014 in GB 1320120.7.
UKIPO Search Report; GB 1320120.7; Jan. 29, 2015, 3 pages.
Tseng, et al.; An Integrated Linear Regulator with Fast Output Voltage Transition for Dual-Supply SRAMs in DVFS Systems; IEEE Journal of Solid-State Circuits; vol. 45, No. 11; pp. 2239-2249; Nov. 2010.

\* cited by examiner

LEAKAGE CURRENT REDUCTION IN AN INTEGRATED CIRCUIT

BACKGROUND OF THE INVENTION

1. Field of the Invention

This invention relates to the field of integrated circuits. More particularly, this invention relates to techniques for the reduction of leakage current within integrated circuits.

2. Description of the Prior Art

As process geometries have become smaller, a growing problem is that of leakage current. Leakage current occurs when a transistor is notionally in its switched off state, but nevertheless some current does pass through the transistor. These leakage currents become higher as the transistor becomes smaller in size.

One known technique for the reduction of leakage currents is to use header and footer transistors around the functional circuitry. The header and/or footer transistors supply power to a virtual power rail and then the functional circuits, such as the normal processing circuits required to do the desired processing operations of an integrated circuit, draw their electrical power from the virtual power rails. When it is desired to power down the integrated circuit, then the header and/or footers can be used to isolate the virtual power rails from the power supplies to which they are connected during functional operation. It may also be desired to hold the integrated circuit in a retention mode in which state data is retained within the integrated circuit and the clock is stopped. The integrated circuit may be then resume processing rapidly by restarting the clock and the retained state data will be immediately available. In order to reduce power consumption during such a retention mode of operation, it is known to utilise header and/or footer transistors to at least partially isolate the virtual power rails from the power supplies such that the voltage difference supplied to the functional circuits is reduced and the leakage currents through those functional circuits are reduced. One problem is that if the voltage difference between the virtual rails becomes too low during the retention mode then it is more difficult to rapidly restart processing, e.g. either a long time is taken to bring the virtual power rails back to an operational voltage or there is a risk of the voltage across the functional circuits dipping too low resulting in data loss if the functional circuits resume processing operations and drawing power too soon.

SUMMARY OF THE INVENTION

Viewed from one aspect the present invention provides an integrated circuit comprising:

a virtual power supply rail coupled via at least one operational mode transistor to a first power supply having a first voltage level;

functional circuitry coupled to said virtual power supply rail to draw power therefrom at a virtual rail voltage;

control circuitry coupled to said at least one operational mode transistor and configured to supply a control voltage with a control voltage level to said at least one operational mode transistor to control current flow through said at least one operational mode transistor; and voltage sensor circuitry coupled to said virtual power supply rail and said control circuitry and configured to sense said virtual rail voltage and to generate a sensed voltage signal for supply to said control circuitry; wherein said control circuitry is configured to operate in an adaptive retention mode when said at least one operational mode transistor is in a high impedance state to vary said control voltage supplied to said at least one operational mode transistor in dependence upon said sensed voltage signal such that:

(i) a voltage difference between said control voltage level and said virtual rail voltage is greater than a voltage difference between said first voltage level and said virtual rail voltage; and (ii) said virtual rail voltage has a predetermined target level.

The present technique utilises the operational mode transistors, which provide power to the virtual power rail, and controls these during an adaptive retention mode with a control signal so that the leakage current through these operational mode transistors is sufficient to provide a virtual rail voltage having a predetermined target level. The operational mode transistors are controlled by a control voltage which provides a bulk bias voltage to the operational mode transistors at a level that has a voltage difference from the virtual rail voltage that is greater than the voltage difference of the first voltage level (normal power supply) from the virtual rail voltage. The operational mode transistors are thus overdriven in reverse to reduce their current leakage and to control their current leakage to a level at which a desired virtual rail voltage is maintained. Feedback from a sensor that generates a sense voltage signal from the virtual rail voltage is used to control the generation of the control signal that is supplied to the operational mode transistors. There is thus provided a closed loop feedback mechanism which controls the reverse overdriving of the operational mode transistors by a bulk bias voltage or a gate bias voltage in a manner in which provides a desired virtual rail voltage.

The operational mode transistors may in some embodiments be connected in parallel with at least one retention mode transistor. The at least one retention mode transistor may be physically smaller than the at least one operational mode transistor such that even when it is switched on, it does not provide enough current that it could support operational mode of the functional circuits. Such retention mode transistors may be used to provide a static retention mode in which the operational mode transistors are not actively controlled via their bias, or alternatively may also contribute in supporting the virtual rail voltage during the adaptive retention mode by being in their low impedance state during the adaptive retention mode with the operational mode transistors having their leakage controlled so as to top up the current supplied to the virtual rail so as to achieve the desired virtual rail voltage.

As previously mentioned, the control voltage may provide a gate bias voltage to the operational mode transistors. In other embodiments the control voltage may provide a bulk bias voltage to operational mode transistors in the form of PMOS transistors.

In the adaptive retention mode, the retention mode transistors may operate in saturation such that they conduct a current with a magnitude substantially independent of the voltage difference across the retention mode transistors, i.e. the current through the retention mode transistors is controlled by carrier characteristics within the retention mode transistors rather than the applied potential difference.

The first voltage level supplied during normal operations of the functional circuits has a level selected to permit those functional circuits to operate to perform their desired processing operations without being too high and thereby causing excessive leakage. The control voltage level needs to be such that it can provide a voltage difference from the virtual rail voltage that exceeds the voltage difference between the normal power supply voltage and the virtual rail voltage. This may be achieved in circuits having interface circuitry operating at an interface voltage level by using this interface voltage level as the control voltage level since the interface voltage level will typically be higher than the operating voltage of the integrated circuit, e.g. the operating voltage of the functional circuits may typically be 1.0V whereas the interface voltage level for communicating off-chip may be 1.8V.

The control circuitry may include comparator circuitry for comparing the sensed voltage signal with a reference signal to determine if the virtual rail voltage has the predetermined target level. The sense voltage signal may be passed through a low pass filter prior to reaching the comparator circuitry so as to reduce the effect of noise or other ripple effects on the sensed voltage signal that could induce undesired fluctuations in the virtual rail voltage.

The reference signal against which the comparator circuitry compares the sensed voltage signal may be derived from a programmable digital reference signal which is supplied to the control circuitry. The control circuitry can thus be programmed to provide a desired virtual rail voltage during the adaptive retention mode.

The predetermined target level for the virtual rail voltage may be a single voltage level or may be a target range.

When in the operational mode the control circuitry generates a control signal to control the operational mode transistor to have a low impedance state and to operate in non-saturation to conduct a non-saturation current with a magnitude substantially dependent upon a voltage difference across the operational mode transistors.

The control circuitry can also support a static retention mode which generates a control signal in which the at least one operational mode transistor has a high impedance state and the control voltage level used for the operational mode transistors is substantially the first voltage level (e.g. the power supply level for the functional circuits).

Viewed from another aspect, the present invention provides an integrated circuit comprising:

virtual power supply rail means for connecting via at least one operational mode transistor to a first power supply having a first voltage level;

functional means for drawing power from said virtual supply rail means at a virtual rail voltage;

control means for supplying a control voltage with a control voltage level to said at least one operational mode transistor to control current flow through said at least one operational mode transistor; and voltage sensor means for sensing said virtual rail voltage and for generating a sensed voltage signal for supply to said control means; wherein said control means is configured to operate in an adaptive retention mode when said at least one operational mode transistor is in a high impedance state to vary said control voltage supplied to said at least one operational mode transistor in dependence upon said sensed voltage signal such that:

(i) a voltage difference between said control voltage level and said virtual rail voltage is greater than a voltage difference between said first voltage level and said virtual rail voltage; and (ii) said virtual rail voltage has a predetermined target level.

Viewed from a further aspect the present invention provides a method of operating an integrated circuit comprising the steps of:

connecting a virtual supply rail via at least one operational mode transistor to a first power supply having a first voltage level;

drawing power for functional circuitry from said virtual supply rail means at a virtual rail voltage;

supplying a control voltage with a control voltage level to said at least one operational mode transistor to control current flow through said at least one operational mode transistor;

sensing said virtual rail voltage;

generating a sensed voltage signal;

operating in an adaptive retention mode when said at least one operational mode transistor is in a high impedance state to vary said control voltage supplied to said at least one operational mode transistor in dependence upon said sensed voltage signal such that:

(i) a voltage difference between said control voltage level and said virtual rail voltage is greater than a voltage difference between said first voltage level and said virtual rail voltage; and (ii) said virtual rail voltage has a predetermined target level.

Another technique used in supporting reduced power consumption in integrated circuits is DVFS (dynamic voltage and frequency scaling) in which the voltage and/or clock frequency supplied to functional circuitry is changed to support different performance levels with different power consumptions. It can be difficult to provide a power supply supporting multiple different supply voltages to use as different DVFS operating points.

Viewed from another aspect the invention provides an integrated circuit comprising:

a virtual power supply rail coupled via at least one operational mode transistor to a first power supply having a first voltage level;

functional circuitry coupled to said virtual power supply rail to draw power therefrom at a virtual rail voltage;

control circuitry coupled to said at least one operational mode transistor and configured to supply a control voltage with a control voltage level to said at least one operational mode transistor to control current flow through said at least one operational mode transistor; and voltage sensor circuitry coupled to said virtual power supply rail and said control circuitry and configured to sense said virtual rail voltage and to generate a sensed voltage signal for supply to said control circuitry; wherein said control circuitry is configured to operate in a dynamic voltage and frequency scaling mode in which said control voltage level is varied so as to maintain said virtual rail voltage at a predetermined target level below said first voltage level while said functional circuitry is active in performing processing operations under control of a clock signal of an operating frequency supplied to said functional circuitry, said operating frequency varying with said predetermined target level; and said control circuitry is configured to have a time constant characterising a rate at which said control voltage level changes when said virtual rail voltage changes that is less than a time constant characterising a rate at which said virtual rail voltage changes when said functional circuitry changes an amount of current drawn by said functional circuitry from said virtual power supply rail when performing processing operations.

This technique recognises that providing the control circuitry is able to react sufficiently rapidly, it is possible to control a virtual rail voltage to a desired level below a supply voltage while the functional circuitry is active (clocked) and is performing processing operations.

The operational mode transistors may be arranged to operate in saturation when performing DVFS.

The operational mode transistors may be provided as header and/or footer transistors providing either virtual rail or a virtual ground.

Retention mode transistors may or may not be provided in parallel with the operational mode transistors. It is possible the operational mode transistors alone could be controlled to provide a retention mode voltage in which the functional circuitry is not clocked, but retains state.

Viewed from another aspect the invention provides an integrated circuit comprising:

virtual power supply rail means for connecting via at least one operational mode transistor to a first power supply having a first voltage level;

functional circuit means for drawing power from said virtual power supply rail means at a virtual rail voltage;

control means for supplying a control voltage with a control voltage level to said at least one operational mode transistor to control current flow through said at least one operational mode transistor; and voltage sensor means for sensing said virtual rail voltage and to generate a sensed voltage signal for supply to said control circuitry; wherein said control means is configured to operate in a dynamic voltage and frequency scaling mode in which said control voltage level is varied so as to maintain said virtual rail voltage at a predetermined target level below said first voltage level while said functional circuit means is active in performing processing operations under control of a clock signal of an operating frequency supplied to said functional circuit means, said operating frequency varying with said predetermined target level; and said control means is configured to have a time constant characterising a rate at which said control voltage level changes when said virtual rail voltage changes that is less than a time constant characterising a rate at which said virtual rail voltage changes when said functional circuit means changes an amount of current drawn by said functional circuit means from said virtual power supply rail means when performing processing operations.

Viewed from a further aspect the invention provides a method of operating an integrated circuit comprising the steps of:

connecting a virtual power supply rail via at least one operational mode transistor to a first power supply having a first voltage level;

drawing power for functional circuitry from said virtual power supply rail at a virtual rail voltage;

supplying from control circuitry a control voltage with a control voltage level to said at least one operational mode transistor to control current flow through said at least one operational mode transistor;

sensing said virtual rail voltage and to generate a sensed voltage signal for supply to said control circuitry; and operating in a dynamic voltage and frequency scaling mode in which said control voltage level is varied so as to maintain said virtual rail voltage at a predetermined target level below said first voltage level while said functional circuitry is active in performing processing operations under control of a clock signal of an operating frequency supplied to said functional circuitry, said operating frequency varying with said predetermined target level; wherein said control circuitry is configured to have a time constant characterising a rate at which said control voltage level changes when said virtual rail voltage changes that is less than a time constant characterising a rate at which said virtual rail voltage changes when said functional circuit means changes an amount of current drawn by said functional circuitry from said virtual power supply rail means when performing processing operations.

The above, and other objects, features and advantages of this invention will be apparent from the following detailed description of illustrative embodiments which is to be read in connection with the accompanying drawings.

DESCRIPTION OF THE EMBODIMENTS

Figure 1:
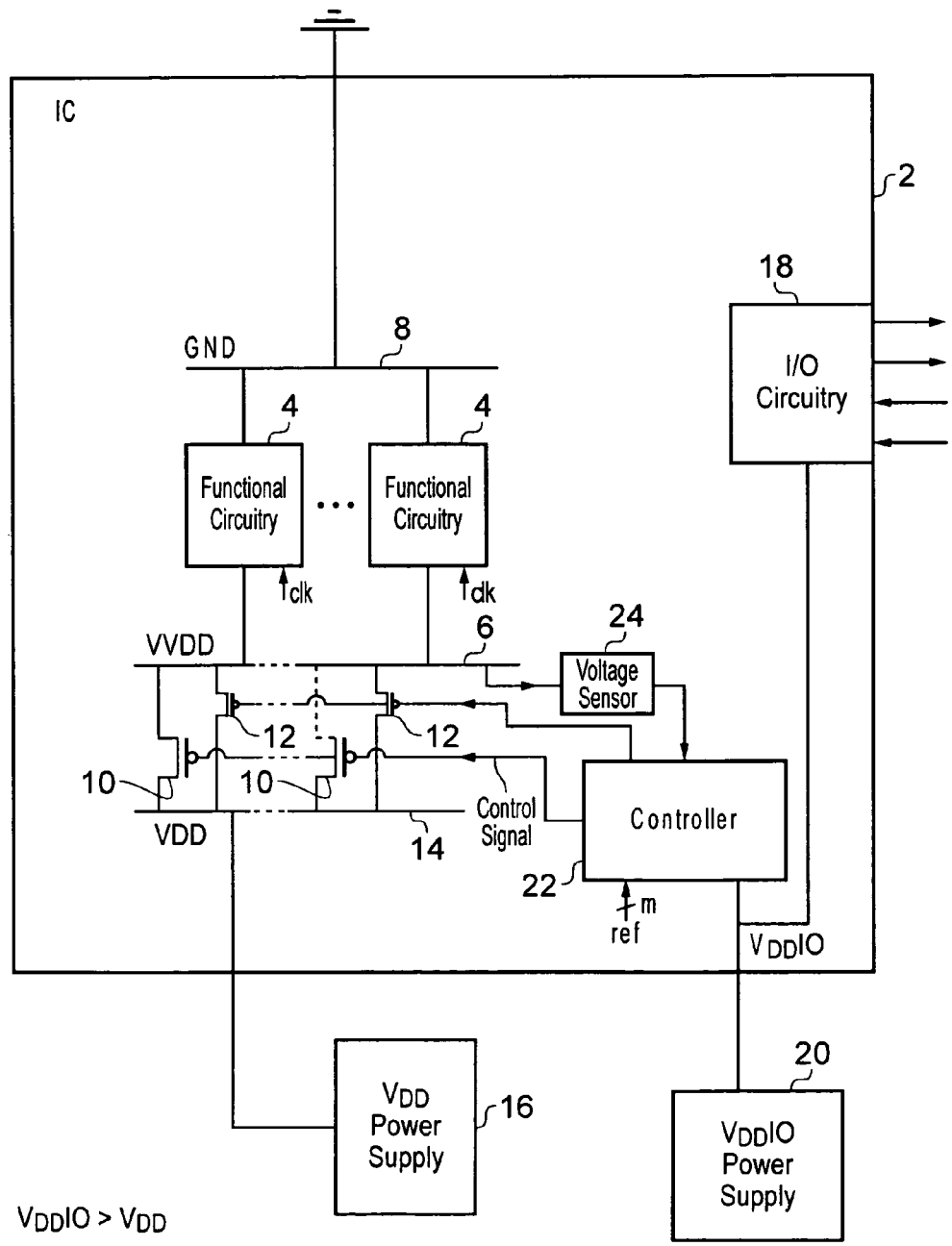
FIG. 1 schematically illustrates an integrated circuit supporting an adaptive retention mode.

FIG. 1 schematically illustrates an integrated circuit 2 including a plurality of functional circuits 4 connected to a virtual power rail 6 and a ground power rail 8. The virtual power rail 6 is connected via operational mode transistors 10 and retention mode transistors 12 to a VDD power rail 14 that connects to a VDD power supply 16. The VDD power supply 16 may typically supply a power supply voltage of, for example, 1.0V resulting, after the voltage drop across the operational mode transistors 10 and the retention mode transistors 12, in an operating voltage of 0.95V upon the virtual power rail 6 during the operational mode.

Also provided within the integrated circuit 2 is interface circuitry 18 supplied with its own interface power supply at a voltage level VDD 10 from a VDD 10 power supply 20. The VDD 10 interface voltage level is higher than the main power supply voltage level VDD, e.g. the interface voltage level may be 1.8V.

Controller circuitry 22 is supplied with a sensed voltage signal obtained from a voltage sensor 24 that is coupled to the virtual power rail 6 and reads the virtual power rail voltage VVDD. The controller circuitry 22 generates a control signal which is supplied to the operational mode transistors 10 to switch these between a high impedance state and a low impedance state. The control circuitry 22 also supplies a signal which switches the retention mode transistors 12 between a high impedance state and a low impedance state.

Figure 2:
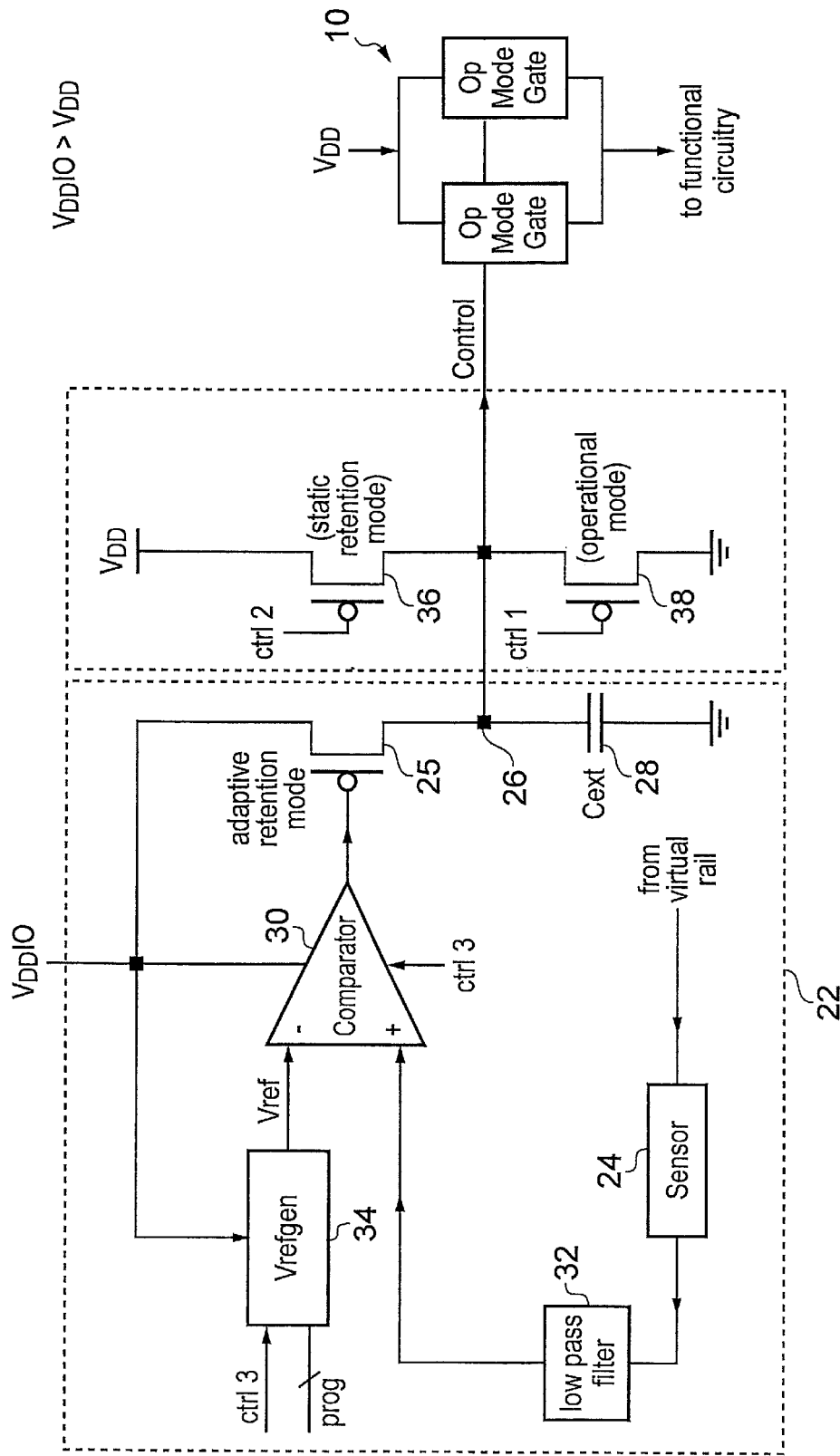
FIG. 2 schematically illustrates control circuitry for controlling the operation of header transistors in various modes.

FIG. 2 schematically illustrates the control circuitry 22 in more detail. The operational mode transistors 10 are supplied with a control signal which controls the current flow through the operational mode transistors 10. The control signal may serve as a gate bias voltage or a bulk bias voltage to the operational mode transistors 10. When operating in the adaptive retention mode, the control signal is derived from the interface voltage level VDD 10 and supplied via transistor 25 and node 26. A smoothing capacitor 28 serves to smooth any short term variations in the control signal supplied to the operational mode transistors 10. The transistor 25 is active in the adaptive retention mode and is switched between a conductive and a non-conductive state by a comparator 30. The comparator 30 is enabled by a control signal ctrl3 so as to be active in the adaptive retention mode and serves to compare a reference signal Vref with a low pass filtered version of the sensed voltage signal from the virtual power rail. A low pass filter 32 serves to remove noise or other short term variations in the sense voltage signal before this is supplied to the comparator 30. The reference signal Vref is produced by a reference generator 34 under control of a programmable reference control signal prog which can be set under hardware or software control to control the predetermined target value for the virtual rail voltage to be used during adaptive retention mode.

During the adaptive retention mode, the comparator 30 compares the reference signal Vref with the sensed voltage signal and switches on the transistor 25 to increase the control signal voltage level if the virtual rail voltage VVDD is greater than its target value. Increasing the control signal voltage level in this way increases the overdrive of the control signals supplied to the operational mode transistors 10 and accordingly reduces the leakage through these operational mode transistors 10 and thereby brings down the virtual rail voltage VVDD. Conversely, if the virtual rail voltage VVDD is less than target, then the transistor 25 is switched off and the control signal voltage level falls thereby decreasing overdrive of the operational mode transistors 10 and increasing their leakage so as to increase the virtual rail voltage VVDD. The control circuitry 22 thus provides closed loop feedback control of the virtual rail voltage VVDD via signals which overdrive the operational mode transistors 10 with a control signal derived from a higher voltage signal VDD 10 compared to the normal operating voltage VVD of the functional circuits.

Also illustrated in FIG. 2 are a control transistor 36 and a control transistor 38 which are responsible for generating control signal voltages for supply to the operational mode transistors 10 during normal operational mode and static retention mode respectively. The control signal voltages in the operational mode and the static retention mode are derived from the normal operating voltage VDD rather than the interface voltage level VDD IO. Thus, in the static retention mode, the operational mode transistors 10 are not overdriven via a gate bias voltage or bulk bias voltage in the manner in which they are so driven during the adaptive retention mode. Control signals Ctrl1 and Ctrl2 control whether or not the operational mode or the static retention mode is active. The moving between the different modes of operation (adaptive retention mode, operational mode and static retention mode) may be performed under control of a finite state machine (not illustrated) as will be familiar to those in this technical field. It will be appreciated that in FIGS. 1 and 2 only a relatively small number of operational mode transistors 10 and retention mode transistors 12 have been illustrated. In practice, many more such transistors will be provided. The operational mode transistors may be split into groups associated with different virtual power rails and separately controlled via their own feedback loops to achieve the desired predetermined target value for the associated virtual rail voltage.

Figure 3:
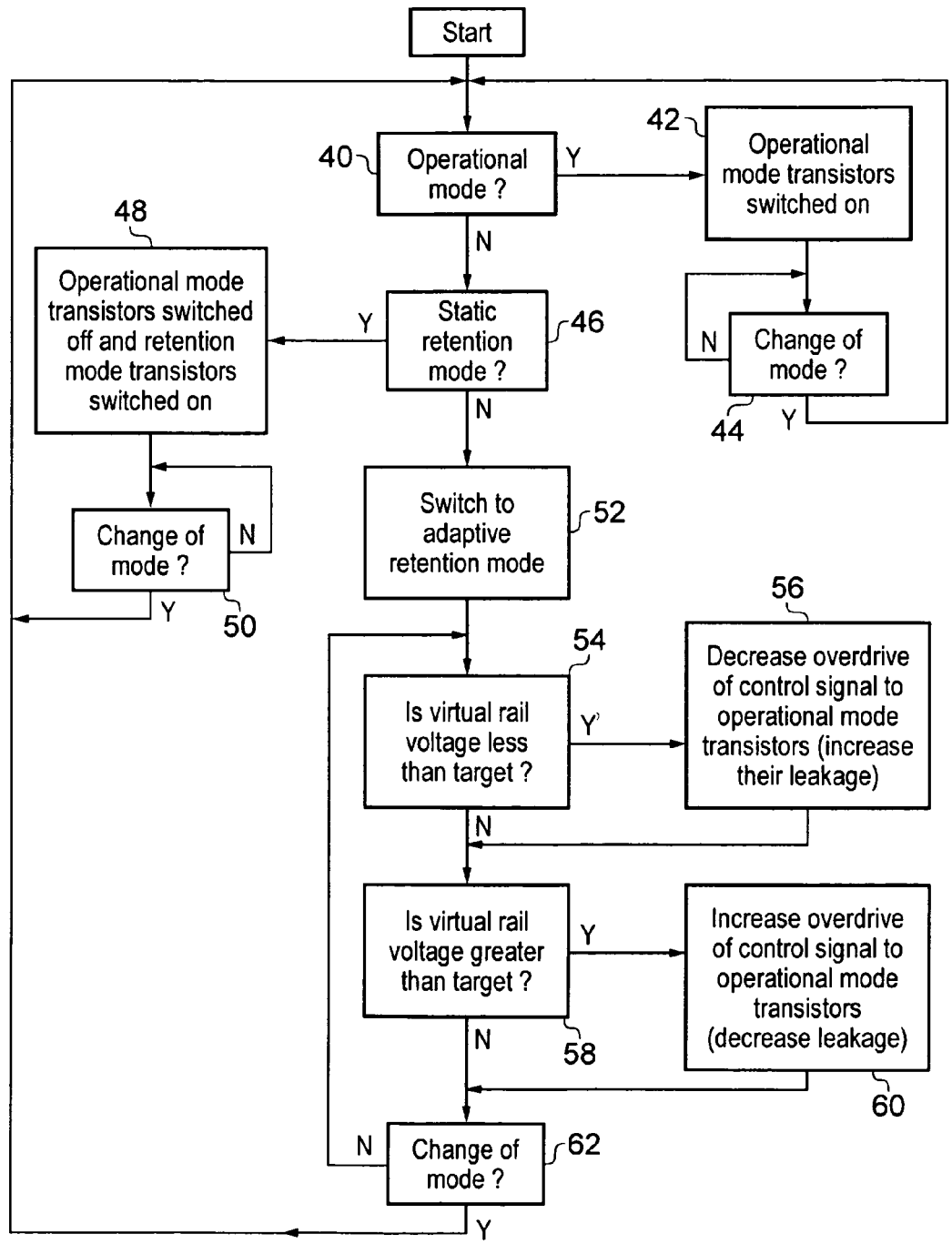
FIG. 3 is a flow diagram schematically illustrating switching between different modes of operation and the control of the operational mode transistors and the retention mode transistors in those different modes.

FIG. 3 is a flow diagram schematically illustrating switching between different modes of control of the virtual rail voltage VVDD and how the operational mode transistors 10 and retention mode transistors 12 are controlled in those different modes.

At step 40 a determination is made as to whether or not the operational mode is active. If the operational mode is active, then step 42 switches the operational mode transistors 10 to their low impedance state and step 44 waits until a change of mode occurs at which time processing proceeds to step 40.

If the determination is made at step 40 that the system is not in the operational mode, then step 46 determines whether or not the system is in the static retention mode. If the system is in the static retention mode, then step 48 switches the operational mode transistors 10 to their high impedance state and the retention mode transistors 12 to their low impedance state. This provides a virtual rail voltage sufficient to avoid data loss within the functional circuits 4. Processing then waits at step 50 until a change of mode is detected at which time processing returns to step 40.

If the determination at step 46 is that the system is not in the static retention mode, then the system must be in the adaptive retention mode and this is adopted at step 52. At step 54 a determination is made as to whether or not the virtual rail voltage VVDD is less than the predetermined target value. If the virtual rail voltage VVDD is less than the predetermined target value, then step 56 serves to decrease the overdrive of the control signal to the operation mode transistors 10 thereby increasing their leakage.

If the determination at step 54 is that the virtual rail voltage VVDD is not less than the predetermined target, then step 58 determines whether or not the virtual rail voltage VVDD is greater than the predetermined target value. If the virtual rail voltage VVDD is greater than the predetermined target value, then step 60 serves to increase the overdrive of the control signal to the operational mode transistors 10 and thereby decrease their leakage. If the virtual rail voltage VVDD is not greater than the predetermined target, then step 60 is bypassed and processing at step 62 determines whether or not a change of mode has occurred. If no change of mode has occurred, then processing is returned to step 54. If a change of mode has occurred, then processing is returned to step 40.

Figure 4:
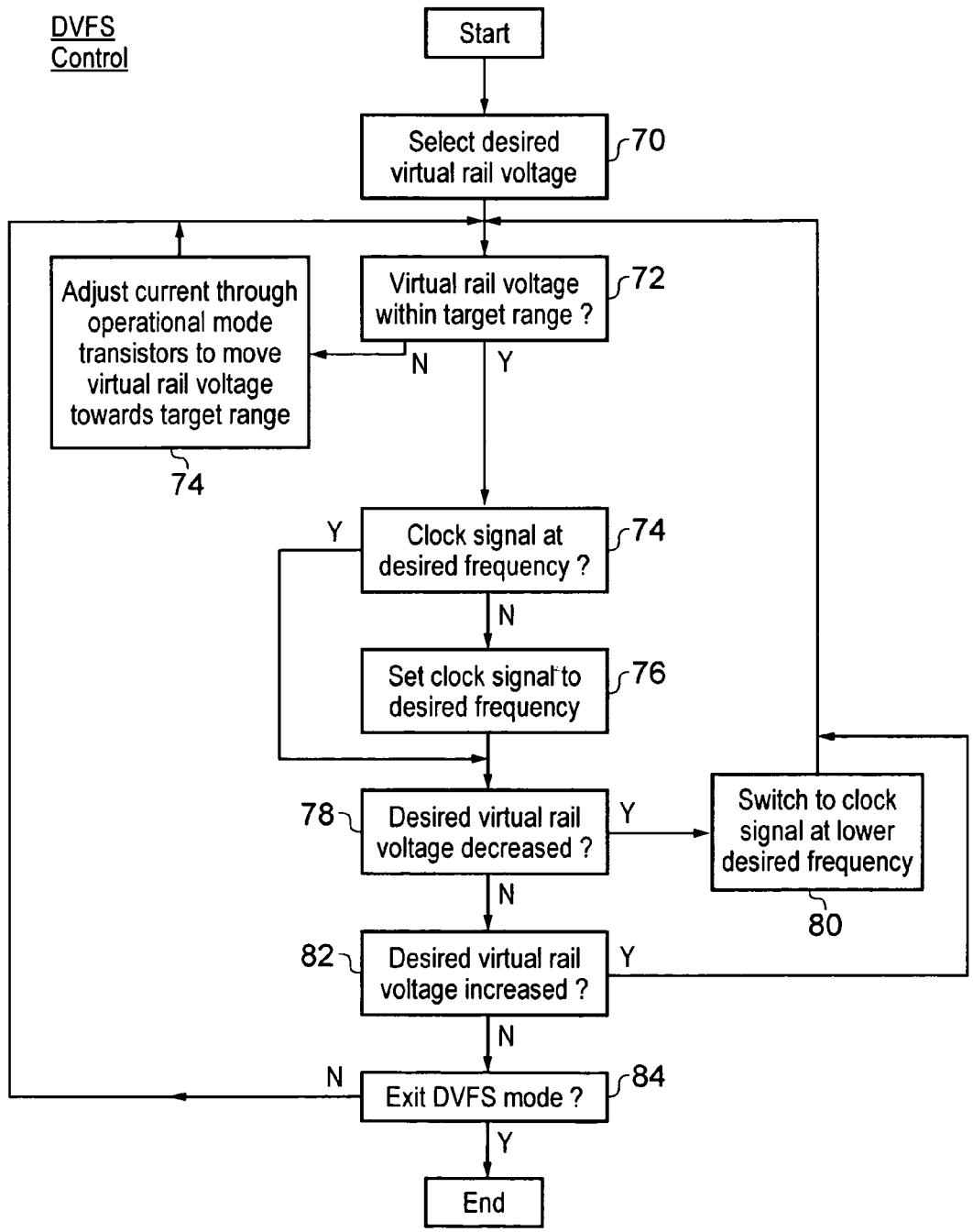
FIG. 4 schematically illustrates operation within a DVFS operational mode.

FIG. 4 schematically illustrates the operation of the circuit of FIG. 2 during a DVFS operational mode. DVFS is used to lower the power consumption of an integrated circuit by using a lower operating voltage when possible. Lower operating voltages will typically support lower maximum clock frequencies and so it is necessary to reduce the operating clock frequency of the functional circuitry as the operating voltage of that functional circuitry is reduced.

In the described embodiments, the operational mode transistors 10 may be used to generate a reduced virtual rail voltage VVDD upon the virtual rail 6 while the functional circuitry 4 is performing data processing operations under control of a clock signal clk. By reducing the gate bias voltage applied as a control signal to the operational mode transistors 10 it is possible to control their saturation current. The current passing through the operational mode transistors 10 passes through the functional circuitry 4 as it performs its processing operations. The amount of current which passes through the functional circuitry 4 when it is performing its processing operations will be proportional to the product of the capacitance of the switched elements within the functional circuitry and the virtual rail voltage VVDD. Thus, as the virtual rail voltage VVDD is reduced, then the current flowing through the functional circuitry will reduce. From the above it will be seen that by adjusting the control signal to the operational mode transistors 10, the virtual rail voltage VVDD may be reduced and this will have the effect of reducing the current flow which passes through the operational mode transistors 10 and the functional circuitry 4 during processing operations. Reducing the current flow has the effect of reducing the power consumed as this will be proportional to the power supply voltage VDD multiplied by the current flowing. Use of the operational mode transistor 10 to reduce the virtual rail voltage VVDD will result in power being consumed by the operational mode transistors 10, but the overall effect will nevertheless be to reduce the total power consumption.

FIG. 4 is a flow diagram schematically illustrating the operation of the control circuitry 22 during DVFS operational mode. At step 70 a desired virtual rail voltage is selected. In practise this may be a target range of voltages within which the virtual rail voltage VVDD should be held. Step 72 then makes a determination with the sensor 24 and the comparator 30 whether or not the virtual rail voltage VVDD is within the target range. If the virtual rail voltage VVDD is not within the target range, then step 74 adjusts the current through the operational mode transistor 10 to move the virtual rail voltage towards the target range. If the virtual rail voltage is too low, then the current through the operational mode transistors 10 increased whereas if the virtual rail voltage VVDD is too high, then the current through the operational mode transistors 10 is decreased. A programmable signal supplied to the reference generator 34 is used to set the target range for the virtual rail voltage VVDD.

When the determination at step 72 is that the virtual rail voltage VVDD has reached its target range, then processing proceeds to step 74 where a determination is made as to whether or not the functional circuitry 4 is currently operating with a clock signal at the desired frequency, i.e. one matching the virtual rail voltage VVDD (which has been stabilised by steps 72 and 74). It may be that the clock is currently stopped, or it may be that the clock is operating at a lower frequency than is desired. If the clock signal is not at the desired frequency, then step 76 sets it to the desired frequency. If the clock signal is already at the desired frequency, then step 76 is bypassed.

Step 78 determines whether or not there has been a change in the desired virtual rail voltage VVDD indicating that this should be decreased. This may be achieved by changing the programmable signals supplied to the reference generator 34. If there has been a change in the desired virtual rail voltage, then step 80 serves to decrease the clock signal frequency to the desired lower level before any changes made to the virtual rail voltage VVDD. It is safe to operate the functional circuitry with a clock signal that is slower than the maximum that may be supported by a given virtual rail voltage VVDD, but it is not safe to operate with a clock frequency that is too high to be supported. Accordingly, when it is desired to decrease the virtual rail voltage VVDD, step 80 first decreases the clock signal frequency before processing passes to step 72 and 74 at which the virtual rail voltage is adjusted down to the decreased virtual rail voltage VVDD.

Step 82 determines whether or not the desired virtual rail voltage VVDD has increased. If it is desired to increase the virtual rail voltage VVDD, then steps 72 and 74 are used to adjust the virtual rail voltage VVDD to this new higher level before steps 74 and 76 switch to use of the corresponding higher frequency clock signal.

Step 84 determines whether or not it is desired to leave the DVFS operational mode. If it is desired to continue in this mode, then processing continues to step 72 where a check is made upon the virtual rail voltage VVDD being within the target range.

In the normal stable operational mode, where the target voltage change and the frequency of the clock signal are not being changed, the processing within the flowchart of FIG. 4 will proceed between the steps 72, 74, 78, 82 and 84 before returning back to step 72. If the virtual rail voltage drifts out of the target range, then step 74 serves to bring the virtual rail voltage VVDD back into the target range.

It will be appreciated that the current drawn through the functional circuitry 4 will depend upon the processing operations being performed, and is not solely dependent upon the clock frequency. If the functional circuitry is performing a particularly computationally intensive task (more gates being switched each cycle), then it may draw a higher current than if it is idling. In order to maintain the virtual rail voltage VVDD within the target range, the time constant characterising the rate at which the control voltage level changes when the virtual rail voltage changes (the delay in response by the control circuitry 22) should be less than the time constant characterising the rate at which the virtual rail voltage changes when the functional circuitry changes an amount of current drawn by the functional circuitry from the virtual power rail when performing processing operations. Thus, the control circuitry 22 operates with a speed of response which is sufficient to change the current flow through the operational mode transistors 10 such that the virtual rail voltage VVDD will not fall too far outside its target range when the current drawn by the functional circuitry 4 changes as a consequence of changes in its processing operations. Providing the speed of response of the control circuitry 22 is sufficiently rapid, the virtual rail voltage VVDD may be maintained even though the current drawn by the functional circuitry 4 is varying with its varying processing operations.

In order to assist in this operation, it may be desirable to distribute virtual rail virtual control circuitry 22 and operational mode transistors 10 across an integrated circuit such that the local virtual rail voltage VVDD is sensed by each control circuitry 22 and used to control corresponding local operational mode transistors 10. Distributing the sensing and control of virtual rail voltage VVDD throughout an integrated circuit in this way by providing multiple instances of control circuitry 22 each with control of nearby operational mode transistors 10, permits more accurate control of the local virtual rail voltage VVDD and is better able to cope with local variations in the current drawn by the functional circuitry 4. As an example, a processor core may contain a plurality of different functional units such as a single-instruction-multiple-data functional unit and a separate floating point unit. It may be that one of these functional units is idle while the other is active. Providing local control circuitry 22 for controlling the operational mode transistors 10 local to each of these different functional units permits the virtual rail voltages VVDD to be maintained for both functional units at near their target values despite very different levels of current drawn by this functional unit in dependence upon their instantaneous processing activity.

FIG. 1 schematically illustrates both operational mode transistors 10 and retention mode transistors 12. It may be that as well as providing the DVFS operational mode as described above, the operational mode transistors 10 may also in some embodiments serve to support the retention mode of operation without requiring the separate retention mode transistors 12. In retention mode the functional circuitry would not be clocked, but state would be maintained within the functional circuitry 4.

The embodiment of FIG. 1 illustrates the operational mode transistors 10 being used to provide a virtual rail voltage VVDD. These are header transistors. It will be appreciated that the present techniques could equally be used in footer transistors to provide a virtual ground rail VGND.

Figure 5:
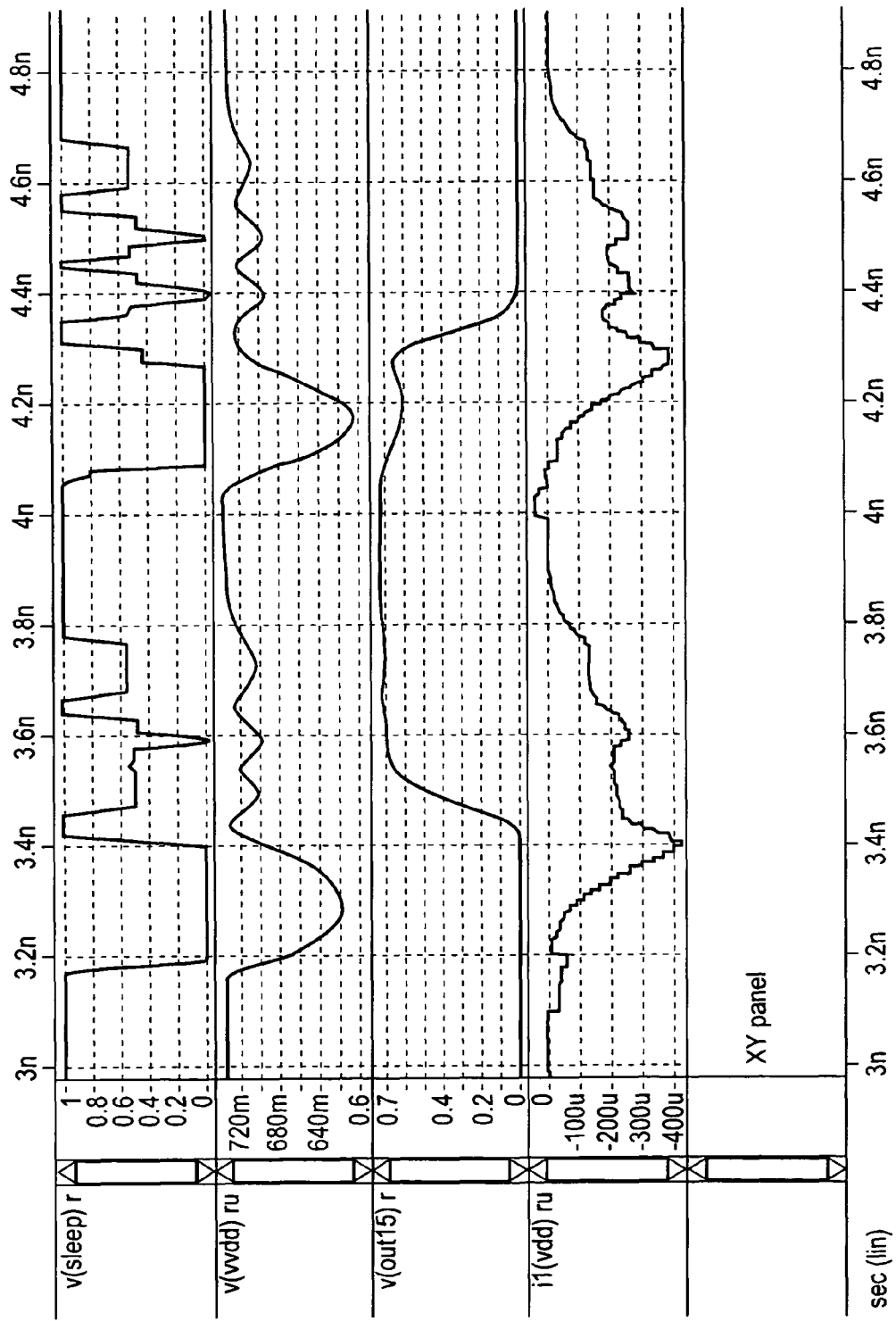
FIG. 5 schematically illustrates the variation of virtual rail voltage ad current through the functional circuitry over different operating conditions.

FIG. 5 schematically illustrates waveforms resulting from use of the techniques described above to control virtual rail voltage VVDD over different operating conditions set by the SLEEP signal (corresponding to different levels of processing activity). It will be seen that the current I1 flowing varies considerably while during the active phases the virtual rail voltage varies less due to the action of the local (distributed) voltage regulators with their rapid response compensating for the regulators for the variations in current drawn.

Although illustrative embodiments of the invention have been described in detail herein with reference to the accompanying drawings, it is to be understood that the invention is not limited to those precise embodiments, and that various

We claim:

1. An integrated circuit comprising:
a virtual power supply rail coupled via at least one operational mode transistor to a first power supply having a first voltage level;
functional circuitry coupled to said virtual power supply rail to draw power therefrom at a virtual rail voltage;
control circuitry coupled to said at least one operational mode transistor and configured to supply a control voltage with a control voltage level to said at least one operational mode transistor to control current flow through said at least one operational mode transistor, wherein said control voltage provides a gate bias voltage to said at least one operational mode transistor; and
voltage sensor circuitry coupled to said virtual power supply rail and said control circuitry and configured to sense said virtual rail voltage and to generate a sensed voltage signal for supply to said control circuitry;
wherein said control circuitry is configured to operate in an adaptive retention mode when said at least one operational mode transistor is in a high impedance state to vary said control voltage supplied to said at least one operational mode transistor in dependence upon said sensed voltage signal such that:
(i) a voltage difference between said control voltage level and said virtual rail voltage is greater than a voltage difference between said first voltage level and said virtual rail voltage; and
(ii) said virtual rail voltage has a predetermined target level;
wherein said first voltage level has a magnitude selected to provide operating power to said functional circuitry and said control voltage level is an interface voltage level with a magnitude selected to provide operating power to interface circuitry of said integrated circuit.

2. An integrated circuit as claimed in claim 1, wherein said control voltage overdrives said at least one operational mode transistor so as to reduce a leakage current therethrough.

3. An integrated circuit as claimed in claim 1, comprising at least one retention mode transistor connected in parallel with said least one operational mode transistor between said first power supply and said virtual power supply rail and wherein during said adaptive retention mode said at least one retention mode transistor is in a low impedance state.

4. An integrated circuit as claimed in claim 3, wherein said at least one retention mode transistor in said adaptive retention mode operates in saturation to conduct a saturation current with a magnitude substantially independent of a voltage difference across said at least one retention mode transistor.

5. An integrated circuit as claimed in claim 1, wherein said at least one operational mode transistor is at least one operational mode PMOS transistor and said control voltage provides a bulk bias voltage to said at least one operational mode PMOS transistor.

6. An integrated circuit as claimed in claim 1, wherein said at least one operational mode transistor comprises at least one operational mode PMOS header transistor.

7. An integrated circuit as claimed in claim 1, comprising comparator circuitry for comparing said sensed voltage signal with a reference signal to determine if said virtual rail voltage has said predetermined target level.

8. An integrated circuit as claimed in claim 7, comprising low pass filter circuitry configured to low pass filter said sensed voltage signal before said sensed voltage signal is supplied to said comparator circuitry.

9. An integrated circuit as claimed in claim 7, wherein said reference signal is generated by said control circuitry with a magnitude controlled by a programmable digital reference signal supplied to said control circuitry.

10. An integrated circuit as claimed in claim 1, wherein said predetermined target level is a predetermined target range.

11. An integrated circuit as claimed in claim 1, wherein said control circuitry is configured to operate in an operational mode to generate a control signal to control said at least one operational mode transistor to have a low impedance state and to operate in non-saturation to conduct a non-saturation current with a magnitude substantially dependent upon a voltage difference across said at least one operational mode transistor.

12. An integrated circuit comprising:
a virtual power supply rail coupled via at least one operational mode transistor to a first power supply having a first voltage level;
functional circuitry coupled to said virtual power supply rail to draw power therefrom at a virtual rail voltage;
control circuitry coupled to said at least one operational mode transistor and configured to supply a control voltage with a control voltage level to said at least one operational mode transistor to control current flow through said at least one operational mode transistor, wherein said control circuitry is configured to operate in a static retention mode to generate a control signal to control said at least one operational mode transistor to have a high impedance state, said control voltage level in said static retention mode being substantially said first voltage level; and
voltage sensor circuitry coupled to said virtual power supply rail and said control circuitry and configured to sense said virtual rail voltage and to generate a sensed voltage signal for supply to said control circuitry;
wherein said control circuitry is configured to operate in an adaptive retention mode when said at least one operational mode transistor is in a high impedance state to vary said control voltage supplied to said at least one operational mode transistor in dependence upon said sensed voltage signal such that:
(i) a voltage difference between said control voltage level and said virtual rail voltage is greater than a voltage difference between said first voltage level and said virtual rail voltage; and
(ii) said virtual rail voltage has a predetermined target level;
wherein said first voltage level has a magnitude selected to provide operating power to said functional circuitry and said control voltage level is an interface voltage level with a magnitude selected to provide operating power to interface circuitry of said integrated circuit.

13. An integrated circuit comprising:
means for connecting via at least one operational mode transistor to a first power supply having a first voltage level;
means for drawing power from said means for connecting at a virtual rail voltage;
means for supplying a control voltage with a control voltage level to said at least one operational mode transistor to control current flow through said at least one operational mode transistor, wherein said control voltage provides a gate bias voltage to said at least one operational mode transistor; and means for sensing said virtual rail voltage and for generating a sensed voltage signal for supply to said means for supplying;

wherein said means for supplying is configured to operate in an adaptive retention mode when said at least one operational mode transistor is in a high impedance state to vary said control voltage supplied to said at least one operational mode transistor in dependence upon said sensed voltage signal such that:
(i) a voltage difference between said control voltage level and said virtual rail voltage is greater than a voltage difference between said first voltage level and said virtual rail voltage; and
(ii) said virtual rail voltage has a predetermined target level;

wherein said first voltage level has a magnitude selected to provide operating power to said means for drawing power and said control voltage level is an interface voltage level with a magnitude selected to provide operating power to interface circuitry of said integrated circuit.

14. A method of operating an integrated circuit comprising the steps of:

connecting a virtual supply rail via at least one operational mode transistor to a first power supply having a first voltage level; drawing power for functional circuitry from said virtual supply rail means at a virtual rail voltage;

supplying a control voltage with a control voltage level to said at least one operational mode transistor to control current flow through said at least one operational mode transistor; sensing said virtual rail voltage, wherein said control voltage provides a gate bias voltage to said at least one operational mode transistor;

generating a sensed voltage signal;

operating in an adaptive retention mode when said at least one operational mode transistor is in a high impedance state to vary said control voltage supplied to said at least one operational mode transistor in dependence upon said sensed voltage signal such that:
(i) a voltage difference between said control voltage level and said virtual rail voltage is greater than a voltage difference between said first voltage level and said virtual rail voltage; and
(ii) said virtual rail voltage has a predetermined target level;

wherein said first voltage level has a magnitude selected to provide operating power to said functional circuitry and said control voltage level is an interface voltage level with a magnitude selected to provide operating power to interface circuitry of said integrated circuit.

* * * * *